United States Patent [19]
Hirose

[11] Patent Number: 4,811,055
[45] Date of Patent: Mar. 7, 1989

[54] PROJECTION EXPOSURE APPARATUS

[75] Inventor: Ryusho Hirose, Kawasaki, Japan

[73] Assignee: Canon Kabushiki Kaisha, Tokyo, Japan

[21] Appl. No.: 212,145

[22] Filed: Jun. 24, 1988

Related U.S. Application Data

[63] Continuation of Ser. No. 145,707, Jan. 15, 1988, abandoned, which is a continuation of Ser. No. 73,856, Jul. 14, 1987, abandoned, which is a continuation of Ser. No. 920,900, Oct. 16, 1986, abandoned, which is a continuation-in-part of Ser. No. 702,890, Feb. 19, 1985, abandoned.

[30] Foreign Application Priority Data

Feb. 27, 1984 [JP] Japan .................. 59-35609
Apr. 11, 1984 [JP] Japan .................. 59-72281
Feb. 6, 1985 [JP] Japan .................. 60-21373

[51] Int. Cl.$^4$ .............................................. G03B 27/42
[52] U.S. Cl. ........................................ 355/53; 355/67; 355/77
[58] Field of Search ............................ 355/53, 67, 77

[56] References Cited

U.S. PATENT DOCUMENTS

| | | | |
|---|---|---|---|
| 4,057,347 | 11/1977 | Moriyama et al. | 355/67 |
| 4,395,117 | 7/1983 | Suzuki | 355/43 |
| 4,538,914 | 9/1985 | Yomoda et al. | 355/53 |
| 4,703,116 | 10/1987 | Bruning . | |

FOREIGN PATENT DOCUMENTS 8600427 1/1986 PCT Int'l Appl. .

OTHER PUBLICATIONS

Article "Square Blue Laser" by Jim Schefter, *Popular Science*, May, 1983.

*Primary Examiner*—Monroe H. Hayes
*Attorney, Agent, or Firm*—Fitzpatrick, Cella, Harper & Scinto

[57] ABSTRACT

A projection exposure apparatus for projecting a pattern of a mask onto a wafer, wherein the wavelength of light irradiating the mask is made adjustable to change the state of image formation, such as the imaging magnification, focus, etc., with respect to the mask pattern projected onto the wafer.

7 Claims, 4 Drawing Sheets

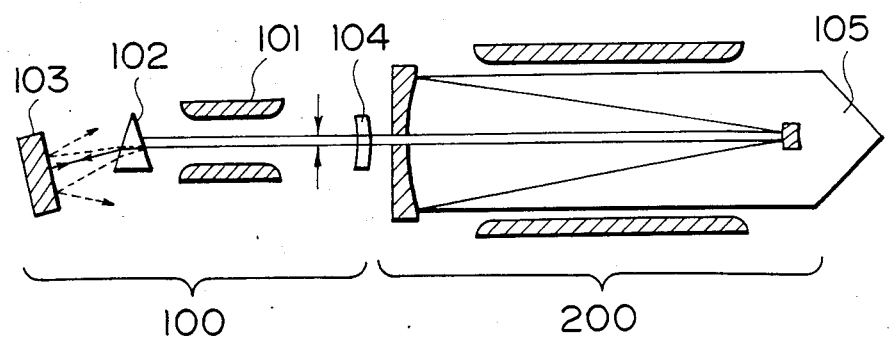
F I G. 2
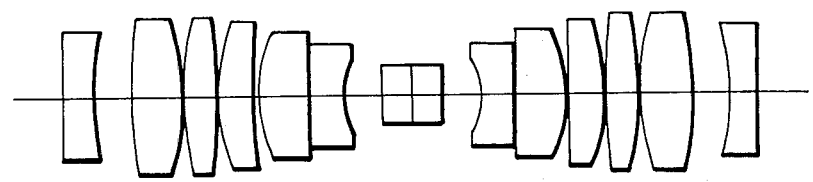
F I G. 3
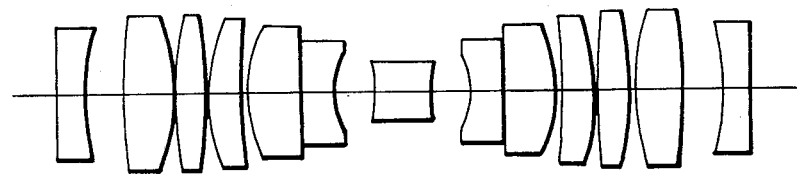
F I G. 5

PROJECTION EXPOSURE APPARATUS

This application is a continuation of application Ser. No. 145,707 filed 1/15/88, now abandoned; which was a continuation of application Ser. No. 073,856 filed 7/14/87, now abandoned; which was a continuation of application Ser. No. 920,900, filed 10/16/86 now abandoned; which was a continuation-in-part of application Ser. No. 702,890, filed 2/19/85 now abandoned.

BACKGROUND OF THE INVENTION

This invention relates to a projection exposure apparatus for projecting, through a projection system such as a lens system, a fine pattern onto a sensitive material to expose it. More particularly, the invention relates to a projection exposure apparatus to be used in the manufacture of semiconductor devices such as integrated circuits (ICs), large scaled integrated circuits (LSIs), etc.

In the pattern projection during the manufacture of semiconductor devices such as ICs, LSIs, etc., a fine circuit pattern of a reticle or mask should be projected onto a wafer with an accurate magnification and in correct focus, to thereby ensure exact image formation on the wafer. However, the exact image formation is not easy to achieve, due to the circumstantial conditions of an imaging system such as heat, atmospheric pressure, humidity, etc. or due to errors caused during the assembling of the imaging system. Moreover, the pattern on a wafer after having been subjected to a specific process such as etching or the like, or the pattern having been formed on a wafer under a temperature condition different from the temperature condition of the projection exposure apparatus during operation thereof tends to contain incorrectness in respect to the exact image formation as described above. If such wafer or mask containing incorrectness is used, it is not possible to accurately align the wafer pattern with the mask pattern, no matter now ideal the imaging projection system is. In an attempt to remove such incorrectness in image formation, particularly errors in the imaging magnification, a proposal has been made in U.S. Pat. No. 4,202,623. According to this proposal, temperature control means are provided to thermally expand or contract at least one of the mask and the wafer so that an image of the mask pattern can be accurately overlaid upon the wafer pattern.

SUMMARY OF THE INVENTION

It is accordingly a primary object of the present invention to provide a projection exposure apparatus capable of adjusting the state of image formation to always assure exact image formation.

Briefly, in order to achieve this, there is provided according to the present invention a projection exposure apparatus wherein the wavelength or wavelength range of mask-illuminating light is made variable to change the projection magnification, focus, etc. to thereby adjust the state of image formation.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a schematic view showing a light source with wavelength changing means employed in the embodiment of FIG. 1.

FIG. 3 is a sectional view schematically showing an imaging system suitably employed in the embodiment shown in FIG. 1.

FIG. 5 is a sectional view showing an imaging system suitably employed in a projection exposure apparatus according to a second embodiment of the present invention.

DESCRIPTION OF THE PREFERRED EMBODIMENTS

Referring first to FIGS. 1-4, a projection exposure apparatus according to a first embodiment of the present invention will be described, particularly with reference to adjustment of the magnification of a projection optical system when it deviates from a specified value due to any errors in assembling accuracies, heat caused by a light source, etc.

Figure 1:
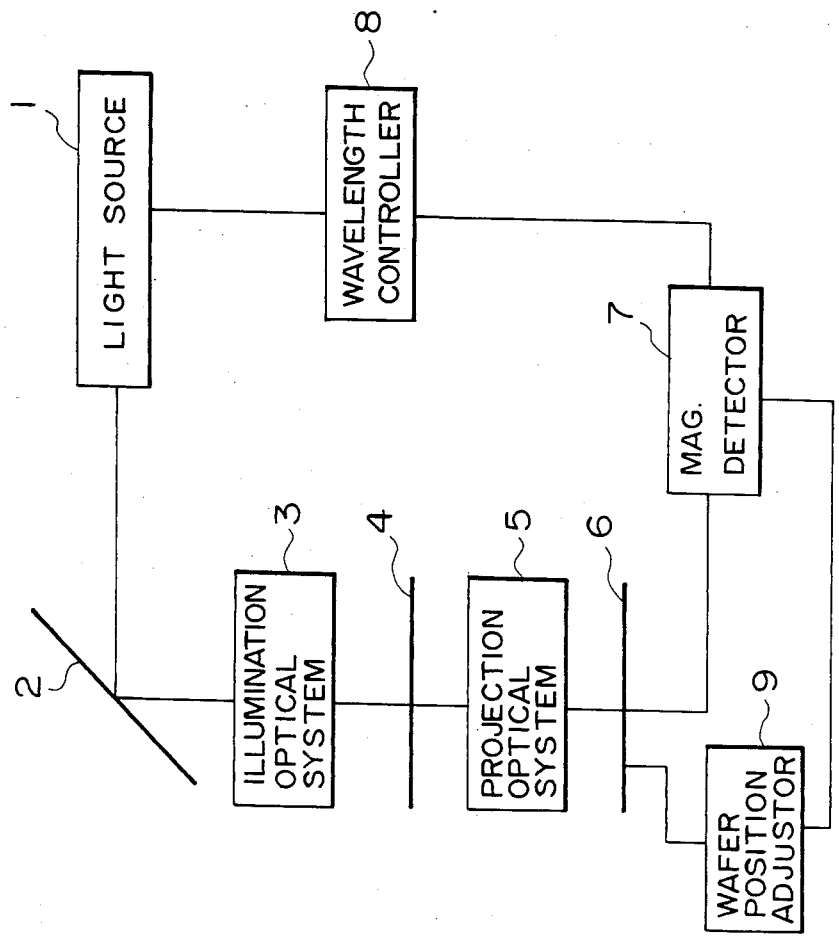
FIG. 1 is a schematic and diagrammatic view showing a projection exposure apparatus according to a first embodiment of the present invention.

In the diagrammatic view of FIG. 1, the projection exposure apparatus includes a light source 1 such as, e.g., an injection-locking type excimer laser, a reflecting mirror 2, an illumination optical system 3 for illuminating a mask 4 having a fine pattern for the manufacture of ICs, LSIs, etc., and a projection optical system 5 for projecting the pattern of the mask 4 onto a wafer 6 which is located in the imaging plane of the projection optical system 5 with reference to the mask 4. The apparatus further includes a magnification detector 7 for detecting the imaging magnification of the projection optical system 5 with reference to the mask 4, a wavelength controller 8 for changing the wavelength of light to be emitted from the light source 1 on the basis of an output signal produced by the magnification detector 7, and a wafer position adjustor for adjusting the position of the wafer 6 on the basis of an output signal produced by the magnification detector 7.

If the imaging magnification of the projection optical system 5 deviates from a predetermined value, such deviation is corrected in accordance with the present embodiment by changing the wavelength of light to be emitted from the light source 1. That is, any error in the imaging magnification is detected by the magnification detector 7. When it is detected, the magnification detector 7 produces a detection signal which is supplied to the wavelength controller 8. In response to the detection signal, the wavelength controller 8 acts on the light source 1 to change the wavelength of light to be emitted therefrom. This will now be described in more detail with reference to FIG. 2.

As is shown in FIG. 2, the injection-locking type excimer laser used as the light source 1 in the present embodiment includes a first resonator generally denoted by reference numeral 100 and a second resonator generally denoted by reference numeral 200. By an oscillator 101 of the first resonator 100, a laser beam having a relatively wide wavelength range is ocsillatingly emitted. The laser beam thus emitted is separated by a prism 102 and the separated rays are directed to a mirror 103 of high reflectance. Among the separated rays, only the rays perpendicularly incident on the mirror 103 are reflected back to the prism 102, while the other rays reflected by the mirror 103 do not enter into the prism 102, as shown by broken lines. Thus, the laser beam entering again into the prism 102 has a single wavelength or a very narrow wavelength range. The laser beam emerging in the opposite direction from the prism 102 passes through a concave half mirror 104 and enters into the second resonator 200. By this second resonator 200, the laser beam having a single wavelength or a very narrow wavelength range is amplified so that a high-power excimer laser beam 105 having a single wavelength or a very narrow wavelength range is produced. Changing the wavelength of the excimer laser beam 105 can be made in a known manner by selecting the wavelength entering again into the prism 102 by rotationally moving the mirror 103 and/or the prism 102. In place of the prism 102 and the mirror 103, an Etalon, which is one of the fabry-perot interferometers, may be used.

The magnification detector 7 comprises in the present embodiment a scanning type photoelectric microscope which is adapted to detect the magnification of the projection optical system 5 in accordance with a conventional technique, i.e. by measuring the size of an image of an object in comparison with the size of the object. More particularly, the images of alignment marks formed on the wafer 6, having a predetermined interspacing, are projected on the mask and the distance between the wafer alignment marks being projected on the mask surface in comparison with the predetermined interspacing of the alignment marks on the wafer 6 is measured. An example of such magnification detecting technique is a semiconductor device manufacturing projection exposure apparatus is described in Japanese Laid-Open Patent Application, Laid-Open No. 108745/1983. On the basis of the result of magnification detection by the magnification detector 7, the wavelength of the laser beam to be emitted from the excimer laser 1 is changed within a region to which the wafer 6 is sensitive, so that an image of the mask 4 is attainable on the wafer 6 exactly at a desired magnification. If the focus position is displaced with the adjustment of the magnification, the wafer 6 is moved by the wafer position adjustor 9 in the direction of the optical axis so that the wafer surface is coincident with the focus position.

A numerical example of the projection optical system in the projection exposure apparatus according to the present embodiment will be shown in the following Example I, while the refractive index $n_d$ of the glass material used in the numerical example with respect to the d-line and the dispersion $v_d$ with respect to d-line standard are shown in Table 1.

EXAMPLE I

| | | |
|---|---|---|
| $R_1 = 1182.83$ | $D_1 = 13.0$ | $SiO_2$ |
| $R_2 = 109.68$ | $D_2 = 15.75$ | |
| $R_3 = 166.81$ | $D_3 = 23.5$ | $SiO_2$ |
| $R_4 = -102.87$ | $D_4 = 0.2$ | |
| $R_5 = 154.17$ | $D_5 = 14.0$ | $CaF_2$ |
| $R_6 = -356.76$ | $D_6 = 1.06$ | |
| $R_7 = 98.47$ | $D_7 = 14.5$ | $CaF_2$ |
| $R_8 = 322.65$ | $D_8 = 1.94$ | |
| $R_9 = 61.05$ | $D_9 = 21.5$ | $CaF_2$ |
| $R_{10} = -393.58$ | $D_{10} = 15.0$ | $SiO_2$ |
| $R_{11} = 32.58$ | $D_{11} = 17.06$ | |
| $R_{12} = -150.94$ | $D_{12} = 25.02$ | $SiO_2$ |
| $R_{13} = 150.94$ | $D_{13} = 17.06$ | |
| $R_{14} = -32.58$ | $D_{14} = 15.0$ | $SiO_2$ |
| $R_{15} = -393.58$ | $D_{15} = 21.5$ | $CaF_2$ |
| $R_{16} = -61.05$ | $D_{16} = 1.94$ | |
| $R_{17} = -322.65$ | $D_{17} = 14.5$ | $CaF_2$ |
| $R_{18} = -98.47$ | $D_{18} = 1.06$ | |
| $R_{19} = 356.76$ | $D_{19} = 14.0$ | $CaF_2$ |
| $R_{20} = -154.17$ | $D_{20} = 0.2$ | |
| $R_{21} = 102.87$ | $D_{21} = 23.5$ | $SiO_2$ |
| $R_{22} = -166.81$ | $D_{22} = 15.75$ | |
| $R_{23} = -109.68$ | $D_{23} = 13.0$ | $SiO_2$ |
| $R_{24} = -1182.83$ | | |

TABLE 1

Refractive Index of the Glass Material of Example I

| Glass Material | Wavelength | | | |
|---|---|---|---|---|
| | 248.5 nm | 249.5 nm | 248 nm | 251.5 nm |
| $SiO_2$ | 1.521130 | 1.519970 | 1.52173 | 1.51775 |
| $n_d = 1.45867$ | | | | |
| $v_d = 67.90$ | | | | |
| $CaF_2$ | 1.46334 | 1.463140 | 1.46344 | 1.46273 |
| $n_d = 1.433870$ | | | | |
| $v_d = 95.10$ | | | | |

Figure 4:
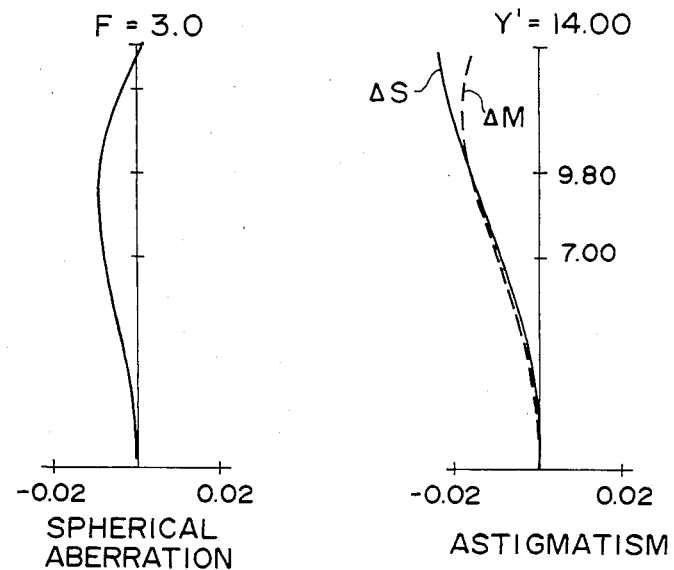
FIG. 4 illustrates the aberrations of the imaging system of FIG. 3.
Figure 4:
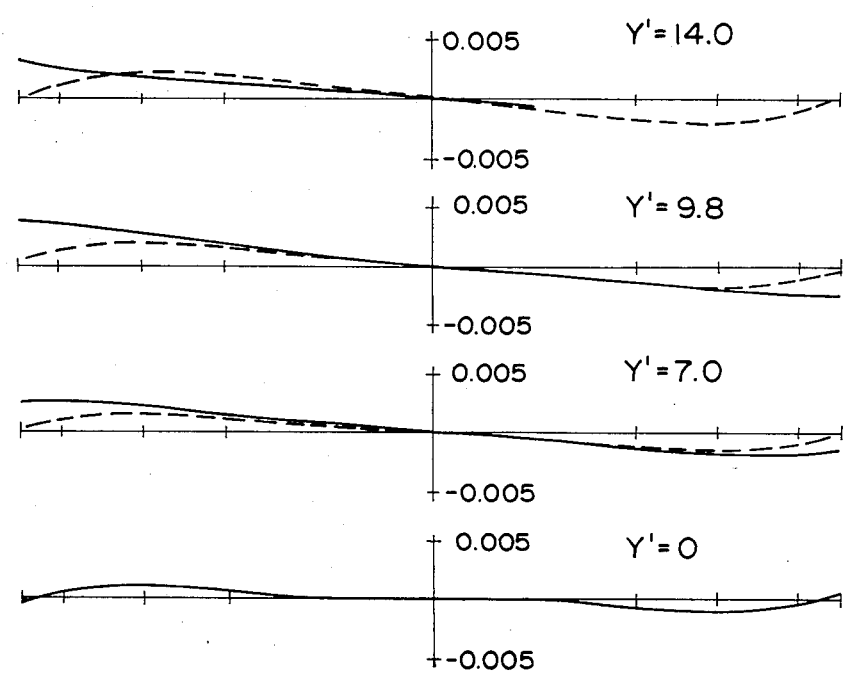

In Example I, $R_i$ designates the radius of curvature of the "i-th" lens surface in the order from the object side, and $D_i$ designates the thickness or length of the "i-th" lens or air space. Also in Example I, the imaging ratio (magnification) is 1:1, the image field is 20×20 mm, and the effective F-number Fe is 3.0. The cross-sectional view of the lens system according to the disclosed numerical example is shown in FIG. 3. Also, various aberrations with respect to a reference wavelength 248.5 nm are shown in FIG. 4. In FIG. 4, ΔS denotes the sagittal image surface, ΔM denotes the meridional image surface, and Y' denotes the image height. When, in Example I, the wavelength is changed from 248.5 nm to 251.5 nm, the corresponding change in the imaging magnification with respect to the image height 14 mm becomes, according to the calculation, 0.14 micron. Thus, in the projection exposure apparatus according to the first embodiment, wavelength change ±3 nm assures magnification adjustment of ±0.28 micron.

Figure 6:
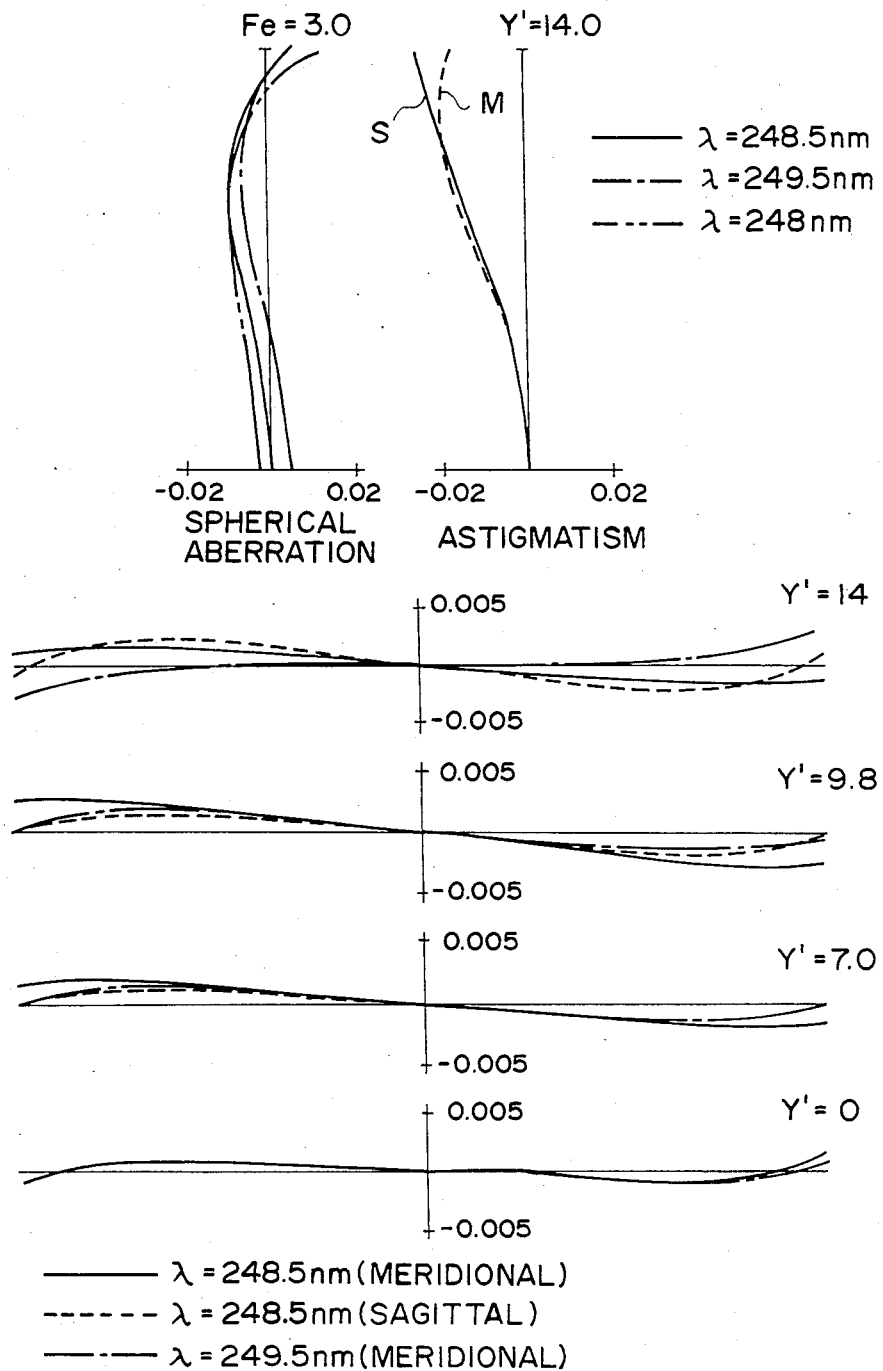
FIG. 6 illustrates the aberrations of the imaging system of FIG. 5.

Referring now to FIGS. 5 and 6, a projection exposure apparatus according to another embodiment of the present invention will be described. If the refractive index, dispersion, etc. of the glass material forming the imaging system are not exactly the same as the designed values, the focal plane and magnification actually established by the imaging system differ from specified ones, respectively. Such inconveniences are removed by the present invention. That is, according to the present invention, the wavelength of the laser beam to be emitted from the excimer laser is shifted from its designed value to another value so that a desired focus position and/or a desired magnification can be obtained. When, for example, correction of the imaging magnification is desired, the actual imaging magnification of the imaging system is detected by the magnification detector such as 7 shown in FIG. 1. Thereafter, on the basis of the result of detection, the wavelength of the laser beam to be emitted from the excimer laser is changed by the wavelength controller such as 8 shown in FIG. 1.

An arrangement of the imaging system suitably applied to the projection exposure apparatus according to the present embodiment is illustrated in FIG. 5, while a numerical example of the imaging system is shown in the following Example II.

EXAMPLE II

| | | |
|---|---|---|
| $R_1 = 1182.83$ | $D_1 = 13.0$ | $SiO_2$ |
| $R_2 = 109.68$ | $D_2 = 15.75$ | |
| $R_3 = 166.81$ | $D_3 = 23.5$ | $SiO_2$ |
| $R_4 = -102.87$ | $D_4 = 0.2$ | |
| $R_5 = 154.17$ | $D_5 = 14.0$ | $CaF_2$ |
| $R_6 = -356.76$ | $D_6 = 1.06$ | |
| $R_7 = 98.47$ | $D_7 = 14.5$ | $CaF_2$ |
| $R_8 = 322.65$ | $D_8 = 1.94$ | |
| $R_9 = 61.05$ | $D_9 = 21.5$ | $CaF_2$ |
| $R_{10} = 393.58$ | $D_{10} = 15.0$ | $SiO_2$ |
| $R_{11} = 32.58$ | $D_{11} = 17.06$ | |
| $R_{12} = -150.94$ | $D_{12} = 25.02$ | $SiO_2$ |
| $R_{13} = 150.94$ | $D_{13} = 17.06$ | |
| $R_{14} = -32.58$ | $D_{14} = 15.0$ | $SiO_2$ |
| $R_{15} = -393.58$ | $D_{15} = 21.5$ | $CaF_2$ |
| $R_{16} = -61.05$ | $D_{16} = 1.94$ | |
| $R_{17} = -322.65$ | $D_{17} = 14.5$ | $CaF_2$ |
| $R_{18} = -98.47$ | $D_{18} = 1.06$ | |
| $R_{19} = 356.76$ | $D_{19} = 14.0$ | $CaF_2$ |
| $R_{20} = -154.17$ | $D_{20} = 0.2$ | |
| $R_{21} = 102.87$ | $D_{21} = 23.5$ | $SiO_2$ |
| $R_{22} = -166.81$ | $D_{22} = 15.75$ | |
| $R_{23} = -109.68$ | $D_{23} = 13.0$ | $SiO_2$ |
| $R_{24} = -1182.83$ | | |

In the above Example II, $R_i$ designates the radius of curvature of the "i-th" lens surface in the order from the object side, and $D_i$ denotes the thickness or length of the "i-th" lens or air space. Also in Example II, the imaging ratio (magnification) is 1:1, the image field is 20×20 mm, and the effective F-number Fe is 3.0.

The aberrations of the imaging system of FIG. 5 are illustrated in FIG. 6.

Description will now be made of further embodiments of the present invention.

Usually, semiconductor devices such as integrated circuits are manufactured by transferring by superimposition or printing different patterns of different masks upon a wafer through different photolithographic exposure processes. Between two exposure processes to be made in sequence, the wafer is subjected to heat treatment such as thermal diffusion. Due to such heat treatment, the wafer is thermally expanded or contracted with the result that the size of the pattern recorded on the wafer or the width of lines constituting the pattern may change. In order to ensure an improvement in the accuracy of overlying one pattern on another in the photolithographic exposure processes, it is desirable that, where a wafer, on which patterns of masks of number n have already been printed, is to be exposed to a pattern of a mask of number n+1, such pattern of the mask n+1 is projected on the wafer in the form of an image having a size or line width that is coordinated with that of the patterns already printed on the wafer. The embodiments to be described below assure this.

In accordance with one form of the present invention, this is achieved in the following manner. First, some of the wafers which have been prepared in one "lot" and which have been subjected to the photolithographic processes using masks of number n, are selected in an arbitrary fashion. Then, the thus selected or extracted wafers are subjected to photoresist coating treatment. Thereafter, they are introduced into the projection exposure apparatus as illustrated in FIG. 1, and images of a pattern of a further mask of number nn+1 are projected upon these wafers in sequence. During such sequential pattern projection relative to the selected wafers, the wavelength of light emitted from the light source 1 (which is an excimer laser in this embodiment) and for irradiating the mask n+1, is changed in sequence. That is, the selected wafers are exposed to the image of the pattern of the mask n+1 with different wavelengths, respectively.

Subsequently,, the wafers are subjected to a developing process, heat treatment and so on. Then, by use of a known type of observation device such as a microscope, each of the wafers is inspected. More particularly, for each of the wafers, the size or line width of the pattern which has just been recorded thereon by the photolithographic process using the mask n+1 is inspected in comparison with that of the pattern or patterns having been printed on the wafer by use of the masks of number n. And, such one of these wafers in which a most desirable dimensional relation is established between the pattern formed with the mask n+1 and the pattern or patterns formed with the masks n, is extracted. Then, the wavelength controller 8 shown in FIG. 1 is operated by an operator so that the light souce 1 emits light of a wavelength which is equal to that used in the photoprinting operation to the single extracted wafer.

Thereafter, the wafers in the aforementioned one lot, except for the first-selected wafers, are introduced into the projection exposure apparatus in sequence, and the operation of projecting a pattern from the mask n+1 to these wafers is effected in sequence.

With this technique, an image of a pattern of a mask can be formed on a wafer, the image having a size or line width that appropriately corresponds to the size or line width of a pattern or patterns having been recorded on the wafer, regardless of thermal expansion or contraction of the wafer, a magnification error of the projection optical system or an error in the size of the mask used. In other words, the pattern of the mask can be projected onto the wafer with a most suitable imaging magnification. Accordingly, the rate at which good articles (e.g. semiconductor chips) are produced can be increased significantly.

The plural-wafer sampling photoprinting with different wavelengths described above may be replaced by single-wafer sampling photoprinting with a particular wavelength. More specifically, a particular wafer is selected and, by use of a particular wavelength, the pattern of the mask n+1 is transferred onto the wafer on which patterns have been recorded using the masks n. After the subsequent developing process and the like, any error in the imaging magnification is detected. The detection of such magnification error is attainable by measuring, by use of a known type of microscope with graduations, the difference in size or line width between the pattern formed by the mask n+1 and the pattern formed by the masks n. As an alternative, the magnification error may be detected by calculation according to the principle described in the aforementioned Japanese Laid-Open Patent Application, Laid-Open No. 108745/1983. That is, it is detectable on the basis of an interspacing between a alignment marks recorded on the wafer by use of the mask n+1 and of an interspacing between alignment marks recorded on the wafer by use of the mask n. In any case, the wavelength of the light to be emitted from the light source 1 is controlled shifted by an amount corresponding to the detected magnification error. And, the remaining wafers are subjected to the photoprinting operation with the mask n+1 by use of the so controlled wavelength.

Further, the wavelength control is attainable by observing an image being projected onto the wafer by the projection optical system 5. That is, the image being projected on the wafer by the projection optical system can be observed by use of an alignment scope included in a projection exposure apparatus. Thus, according to a further aspect of the present invention, a pattern of the mask n+1 as described in the foregoing is projected onto one wafer having patterns recorded thereon by use of the masks n. During this pattern projection, the difference in the size or line width between the image of the mask n+1 pattern being projected and the pattern having been recorded on the wafer or the difference in the interspacing between the alignment marks being projected from the mask n+1 and between the alignment marks having been recorded on the wafer, is observed by use of the alignment scope. And, while continuing such observation, the wavelength of light from the light source is changed until the difference as aforesaid is reduced satisfactory. Then, the remaining wafers are subjected to the photoprinting operation with the wavelength so controlled.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus for projecting an image of a mask onto a wafer, said apparatus comprising:
    an illumination system for irradiating the mask with an illuminating beam having a wavelength;
    a projection system for projecting onto the wafer the image of the pattern of the mask illuminated by said illumination system;
    means for detecting an imaging magnification of said projection system; and
    means for changing the wavelength of the illuminating beam supplied from said illumination system for irradiating the mask, in accordance with the detection by said detecting means.

2. An apparatus according to claim 1, wherein said illumination system includes an excimer laser.

3. A method of projecting an image of a pattern of a mask onto a wafer, comprising the steps of:
    irradiating the mask with an illuminating beam having a wavelength;
    projecting onto the wafer by use of a projection system the image of the pattern of the mask irradiated by the illuminating beam;
    detecting an imaging magnification of the projection system; and
    changing the wavelength of the illuminating beam for irradiating the mask in accordance with the detection of the imaging magnification.

4. A mtethod, usable in projecting with a projection system an image of a first pattern of a first member onto each of a plurality of second members having second patterns of substantially the same size as the first pattern and having photosensitive materials applied thereto, for controlling an imaging magnification upon projection of the image of the first pattern of the first member onto each of the second members by the projection system, said method comprising the steps of:
    projecting, in sequence and by use of the projection system, images of the first pattern of the first member onto different ones of the second members with different wavelengths of light, respectively;
    developing the images of the first pattern of the firsst member having been projected onto the different ones of the second members;
    setting, relative to the projection system, a wavelength of light which is substantially the same as that used for the pattern projection having been made to such one of the aforesaid different ones other second members in which a satisfactory dimensional relation is established between the first pattern and the second pattern as recorded thereon; and
    projecting, in sequence and by use of the projection optical system, images of the first pattern of the first member onto the second members other than the aforesaid different ones, with the set wavelength of light.

5. A method, usable in projecting with a projection system an image of a first pattern of a first member onto a second member having a second pattern, for controlling an imaging magnification upon the projection of the image of the first pattern of the first member onto the second member by use of the projection system, said method comprising the steps of:
    irradiating the first member with a wavelength of light;
    projecting, by use of the projection system, the image of the first pattern of the first member onto the second member;
    changing the wavelength of light for irradiating the first member, while monitoring a dimensional relation between the image of the first pattern being projected onto the second member and the second pattern formed on the second member, until a desired dimensional relation is established therebetween.

6. A method of projecting an image of a pattern of a mask onto a wafer, said method comprising the steps of:
    irradiating the mask with an illuminating beam having a wavelength;
    projecting onto the wafer by use of a projection system the image of a pattern of the mask irradiated by the illuminating beam;
    detecting the size of the image projected by said projection system; and
    changing the wavelength of the illuminating beam for irradiating the mask in accordance with the detection of the size of the projected image.

7. A projection exposure apparatus for projecting an image of a mask onto a wafer, said apparatus comprising:
    an illumination system for irradiating the mask with an illuminating beam having a wavelength;
    a projection system for projecting onto the wafer the image of the pattern of the mask illuminated by said illumination system;
    means for detecting the size of the image projected by said projection system; and
    means for changing the wavelength of the illuminating beam supplied from said illumination system for irradiating the mask, in accordance with the detection by said detecting means.

* * * * *

UNITED STATES PATENT AND TRADEMARK OFFICE
CERTIFICATE OF CORRECTION

PATENT NO. : 4,811,055
DATED : March 7, 1989
INVENTOR(S) : RYUSHO HIROSE

Page 1 of 2

It is certified that error appears in the above-identified patent and that said Letters Patent is hereby corrected as shown below:

COLUMN 1

Line 19, "large scaled" should read --large-scale--.

COLUMN 2

Line 67, "ocsillat-" should read --oscillat--.

COLUMN 3

Line 9, "energing" should read --emerging--.
    Line 21, "fabry-perot" should read --Fabry-Perot--.
    Line 36, "is" should read --in--.

COLUMN 4

Line 59, "mangification" should read --magnification--.

COLUMN 5

Line 67, "number nn+1" should read --number n+1--.

COLUMN 6

Line 8, "Subsequently,," should read --Subsequently,--.
    Line 22, "light souce 1" should read --light source 1--.
    Line 60, "a" should be deleted.

UNITED STATES PATENT AND TRADEMARK OFFICE
CERTIFICATE OF CORRECTION

PATENT NO. : 4,811,055
DATED : March 7, 1989
INVENTOR(S) : RYUSHO HIROSE

Page 2 of 2

It is certified that error appears in the above-identified patent and that said Letters Patent is hereby corrected as shown below:

COLUMN 7

Line 20, "satisfactory." should read --satisfactorily.--.
Line 58, "mtethod," should read --method--.

COLUMN 8

Line 5, "firsst" should read --first--.
Line 12, "other" should read --of the--.

Signed and Sealed this

Twenty-seventh Day of February, 1990

*Attest:*

JEFFREY M. SAMUELS

*Attesting Officer*        *Acting Commissioner of Patents and Trademarks*